(12) United States Patent
Kwok (10) Patent No.: US 9,048,875 B2
(45) Date of Patent: Jun. 2, 2015

(54) CONSERVING COMPUTING RESOURCES DURING ERROR CORRECTION

(75) Inventor: Zion S. Kwok, Burnaby (CA)

(73) Assignee: Intel Corporation, Santa Clara, CA (US)

( * ) Notice: Subject to any disclaimer, the term of this patent is extended or adjusted under 35 U.S.C. 154(b) by 82 days.

(21) Appl. No.: 13/994,938

(22) PCT Filed: Mar. 28, 2012

(86) PCT No.: PCT/US2012/031034
§ 371 (c)(1),
(2), (4) Date: Jun. 17, 2013

(87) PCT Pub. No.: WO2013/147776
PCT Pub. Date: Oct. 3, 2013

(65) Prior Publication Data
US 2013/0339816 A1    Dec. 19, 2013

(51) Int. Cl.
*H03M 13/00*  (2006.01)
*H03M 13/03*  (2006.01)
*H03M 13/13*  (2006.01)
*H03M 13/41*  (2006.01)
*H03M 13/39*  (2006.01)
*H03M 13/29*  (2006.01)
*H03M 13/11*  (2006.01)

(52) U.S. Cl.
CPC .......... *H03M 13/13* (2013.01); *H03M 13/4138* (2013.01); *H03M 13/42* (2013.01); *H03M 13/2957* (2013.01); *H03M 13/2948* (2013.01); *H03M 13/1111* (2013.01); *H03M 13/6505* (2013.01); *H03M 13/6525* (2013.01); *H03M 13/6527* (2013.01); *H03M 13/6577* (2013.01); *H03M 13/6588* (2013.01)

(58) Field of Classification Search
CPC ............ H03M 13/42; H03M 13/2948; H03M 13/2957; H03M 13/3927; H03M 13/4138
USPC .................................................. 714/780, 795
See application file for complete search history.

(56) References Cited

U.S. PATENT DOCUMENTS 6,029,264 A * 2/2000 Kobayashi et al. ............ 714/755
6,233,711 B1 * 5/2001 Murayama et al. ............ 714/786
(Continued)

OTHER PUBLICATIONS

International Search Report and Written Opinion for PCT/US2012/031034, mailed Nov. 30, 2012, 9 pages.
(Continued)

*Primary Examiner* — Joseph D Torres
(74) *Attorney, Agent, or Firm* — Schwabe, Williamson & Wyatt, P.C.

(57) ABSTRACT

Embodiments of the present disclosure describe device, methods, computer-readable media and system configurations for performing data decoding and error correction. In various embodiments, a plurality of bits of encoded data may be received, e.g., by an iterative decoder. In various embodiments, the iterative decoder may generate a set of m tuples A, each tuple in set A including a symbol comprising a group of bits of the encoded data and a probability associated with the symbol. In various embodiments, the encoded data may be decoded using the set of m tuples. In various embodiments, this may include allocating fewer bits to storage of a probability associated with a first tuple of the set A than are allocated for storage of a probability associated with a second tuple of the set A. Other embodiments may be described and/or claimed.

22 Claims, 5 Drawing Sheets

(56) References Cited

U.S. PATENT DOCUMENTS

| | | |
|---|---|---|
| 6,526,531 B1 | 2/2003 | Wang |
| 6,581,182 B1 | 6/2003 | Lee |
| 6,594,318 B1* | 7/2003 | Sindhushayana ............. 375/262 |
| 7,158,589 B2* | 1/2007 | Cameron et al. ............. 375/341 |
| 2001/0010710 A1* | 8/2001 | Kim .............................. 375/265 |
| 2002/0095640 A1* | 7/2002 | Arad et al. .................... 714/792 |
| 2005/0021555 A1 | 1/2005 | Cameron et al. |
| 2011/0126078 A1 | 5/2011 | Ueng et al. |

OTHER PUBLICATIONS

International Preliminary Report on Patentability for PCT/US2012/031034, mailed Oct. 9, 2014, 6 pages.

\* cited by examiner

Fig. 1

| TUPLE POSITION | # BITS ALLOCATED |
| --- | --- |
| 0 | 6 |
| 1 | 6 |
| 2 | 4 |
| 3 | 3 |
| 4 | 3 |
| 5 | 2 |
| 6 | 2 |
| 7 | 2 |
| 8 | 2 |
| 9 | 1 |
| 10 | 1 |
| 11 | 1 |
| 12 | 1 |
| 13 | 1 |
| 14 | 1 |
| 15 | 1 |
| 16 | 1 |
| 17 | 1 |
| 18 | 1 |
| 19 | 1 |
| 20 | 1 |
| 21 | 1 |
| 22 | 1 |
| 23 | 1 |

CONSERVING COMPUTING RESOURCES DURING ERROR CORRECTION

CROSS REFERENCE TO RELATED APPLICATION

The present application is a national phase entry under 35 U.S.C. §371 of International Application No. PCT/US2012/031034, filed Mar. 28, 2012, entitled "CONSERVING COMPUTING RESOURCES DURING ERROR CORRECTION," which designates, among the various States, the United States of America, and the entire contents and disclosures of which are hereby incorporated by reference in their entireties.

FIELD

Embodiments of the present invention relate generally to the field of data processing, and more particularly, to conserving computing resources during error correction.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

An error correction code ("ECC") decoder may be used to decode encoded data, also referred to as "codewords," on a channel. For example, a memory controller may use an ECC decoder to handle bit errors and recover data associated with an ECC codeword stored in a die of non-volatile memory ("NVM"). As another example, an ECC decoder may be used to handle bit errors and recover data associated with encoded incoming data on a wired or wireless communication channel.

An iterative decoder such as a non-binary low-density parity-check ("LDPC") decoder may process a codeword multiple times. Each iteration may bring the codeword closer to the original data. In one form of iterative decoding called "extended min-sum," symbols and associated probabilities that the symbols are correct may be passed between variable nodes and check nodes corresponding to relationships between the variable nodes. During processing, the symbols and the associated probabilities may be stored in various forms of memory.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be implemented. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit ("ASIC"), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smart phone (which may include one or more processors), a tablet, laptop computer, a set-top box, a gaming console, and so forth.

Of all the operations involved in executing a non-binary low-density parity-check ("LDPC") decoder, the operations associated with the computation of check nodes and/or elementary check nodes may require the most resources, such as various types of memory. Accordingly, various techniques are described herein for reducing memory utilization associated with iterative decoding, thereby reducing computing resource utilization.

Figure 1:
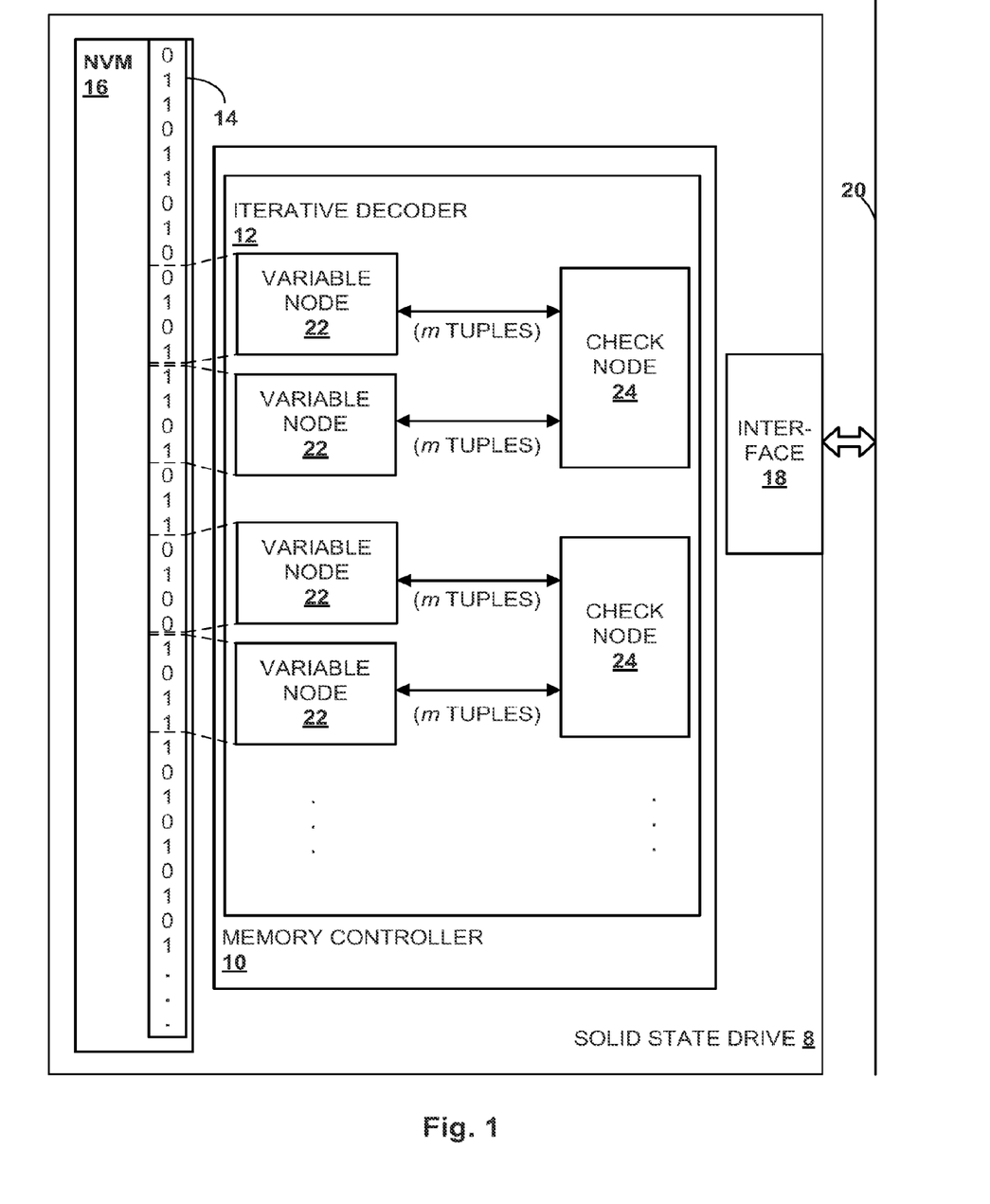
FIG. 1 schematically depicts an example solid state drive with a memory controller including an iterative decoder, in accordance with various embodiments.

Referring now to FIG. 1, a memory device 8, shown here in the form of as solid state drive ("SSD"), may include a memory controller 10. Memory controller 10 in turn may include an iterative decoder 12 configured to decode encoded data, e.g., a "codeword," on a channel 14 of non-volatile memory 16. In various embodiments, memory controller 10 may be separate from but operably coupled to iterative decoder 12. In various embodiments, NVM 16 and memory controller 10 may form integral parts of other types of memory devices, such as hard disk drives ("HDD"). In various embodiments, iterative decoder 12 may be an LDPC decoder, and the codewords on channel 14 may have been encoded with an LDPC encoder (not shown). Other iterative encoding/decoding schemes also may be used.

In various embodiments, memory device 8 may be configured to be coupled to a host computing device (not shown), such as various computing and/or consumer electronic devices/appliances, including but not limited to desktop, laptop, or tablet computers. To that end, an interface 18 may comprise any suitable interface for coupling the memory device 10 to the host computing device, such as, for example, but not limited to, a Serial Advanced Technology Attachment ("SATA") interface, a serial attached SCSI ("SAS") interface, a universal serial bus ("USB") interface, a peripheral control interface ("PCI"), or other suitable device interface. In various embodiments, interface 18 may operably couple memory device 10 to a bus 20, which in turn may be operably coupled to other components (not shown) of the host computing device. In various embodiments, bus 20 may be a SATA bus.

In addition to a channel of memory, in various other embodiments, channel 14 may be any medium capable of storing or transmitting data, including but not limited to a wired or wireless communication channel. For example, LDPC decoding may be used in various wireless communication standards, such as Wi-Fi (IEEE 802.11 family), WiMAX (IEEE 802.16 family), 10 Gigabit Ethernet ("10 GE" or "10 GbE"), and so on. LDPC decoding could also be used with other wireless standards, such as Long Term evolution ("LTE"), 3G, 4G, 5G, and beyond. In such cases, channel 14 may hold LDPC-encoded data received over such a wireless medium.

Regardless of the nature of channel 14, iterative decoder 12 may be configured to divide the codeword among a plurality of variable nodes 22. In binary LDPC decoders, each variable node 22 may be a single bit to store a logical one or a logical zero. In non-binary LDPC decoders, such as iterative decoder 12 in FIG. 1, each variable node 22 may represent a group of bits, and each group may form a q-ary symbol. In either case, the variable nodes 22 may be related or relatable to each other by a plurality of check nodes 24.

As input for iterative decoder 12, soft information such as a probability that each bit and/or group of bits is correct may be generated. For instance, various reference voltages may be applied to a cell of non-volatile memory to determine probability that an initial read of the cell's data is correct. In single-level cell ("SLC") embodiments, the cell may hold a single bit of data (e.g., 0 or 1). In multi-level cell ("MLC") embodiments, more than one bit may be stored in each cell, and the value of the multiple bits may be determined by choosing between multiple levels of electrical charge to apply to floating gates of the cell.

A symbol and a probability that the symbol is correct may be referred to herein as a "tuple" (<symbol, probability>). In various embodiments, the probability may be represented in logarithmic form, e.g., as a log density ratio ("LDR"). In various embodiments, m tuples having the highest probabilities may be utilized, e.g., by iterative decoder 12, for various decoding purposes. In various embodiments, in may be an integer greater than zero (m $\in Z^>$), such as any integer between one and twenty-four, or beyond.

In various situations, such as during iterative decoding of LDPC-encoded data, symbols and associated probabilities of the m tuples (which as noted above may be referred to herein as "tuples") may be stored in various types of memory (e.g., low-level cache, registers on a processor, etc). However, some of these tuples may have probabilities that are low (e.g., they are unlikely to be correct).

Accordingly, in various embodiments, to conserve computing resources during decoding, iterative decoder 12 may allocate fewer bits to storage of relatively low probabilities than are allocated to storage of relatively high probabilities. For example, iterative decoder 12 may allocate fewer bits to storage of a probability associated with a first tuple of the set A than are allocated for storage of a probability associated with a second tuple of the set A, wherein the probability associated with the first tuple is less than the probability associated with the second tuple. More generally, in various embodiments, the m tuples of set A may be sorted by their respective probabilities, and iterative decoder 12 may allocate gradually-decreasing numbers of bits to storage of probabilities associated with tuples of the set A, as the probabilities associated with tuples of the set A decrease.

Figure 2:
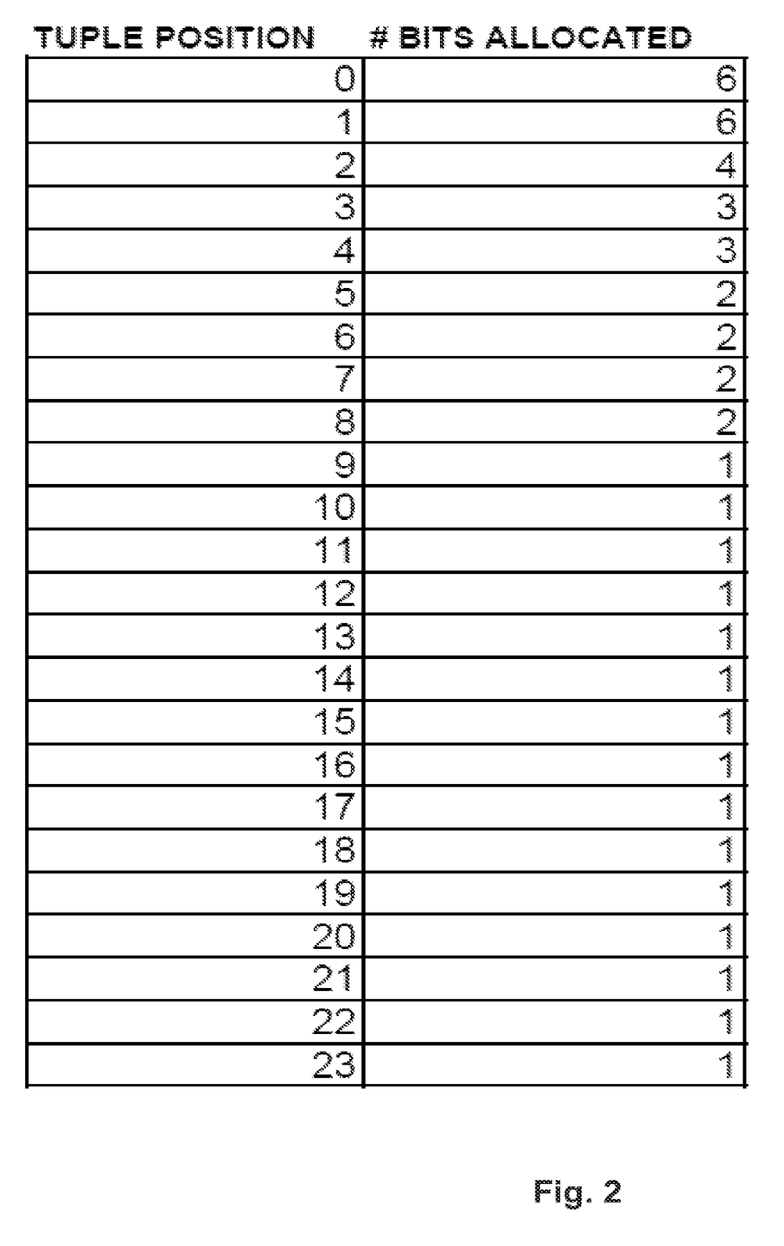
FIG. 2 schematically depicts an example of how bits may be allocated to storage of probabilities associated with groups of bits used during iterative decoding, in accordance with various embodiments.

An example of this is seen in FIG. 2, which depicts a table showing a number of bits allocated to probabilities associated with a set of twenty-four sorted tuples. Tuples having the highest associated probabilities come first, and may have the most bits allocated. For example, probabilities associated with tuples 0 and 1 may be allocated six bits. Tuple 2's associated probability is allocated four bits. The probabilities associated with Tuples 3 and 4 are allocated three bits, and so on. The symbols having the lowest probabilities may be allocated a single bit for storage.

If a probability associated with the one or more tuples requires more than a predetermined number of bits to be expressed, then in various embodiments, the probability may be truncated. For example, the probability associated with Symbol 19 may be 3, which would mean a single bit is not enough to express it (two bits would be required). Thus, the probability may be truncated to the highest value expressible by the number of bits allocated, in this case, one bit. Although this may result in loss of data, because these symbols have relatively low probabilities, the effect of the loss on the decoding process may be minimal.

In various embodiments, rather than storing actual probabilities, differences of probabilities may be stored. In various embodiments, for each tuple $A_x$ of a set of m tuples, wherein $A_0$ is a tuple having a probability greater than or equal to probabilities of all other tuples of set A, and wherein x is an integer and $1 \le x \le m-1$, iterative decoder 12 may store the probability of $A_x$ as a difference between the probability of $A_x$ and a probability of $A_x-1$. As all the differences may have negative signs, in various embodiments, storing the probability of $A_x$ as a difference between the probability of $A_x$ and a probability of $A_{x-1}$ may include storing an absolute value of the difference between the probability of $A_x$ and a probability of $A_{x-1}$.

Figure 3:
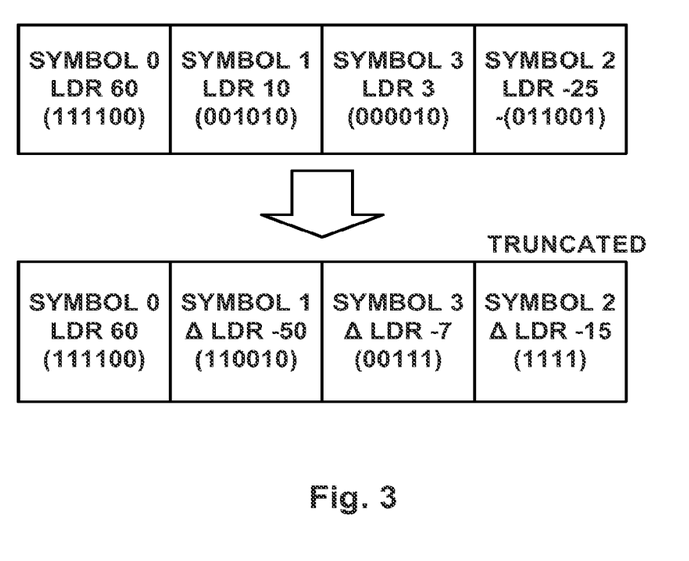
FIG. 3 schematically depicts how probabilities associated with groups of bits may be stored during iterative decoding, in accordance with various embodiments.

An example of this is seen in FIG. 3. At top, four tuples, (<Symbol 0,60>, <Symbol 1,10>, <Symbol 3,3> and <Symbol 2,−25>, are shown sorted, left-to-right, by their LDRs (probabilities). Six bits are used to store the probabilities associated with these tuples (shown in parenthesis in FIG. 3). Using disclosed techniques, computing resources may be conserved by storing these tuples and their respective probabilities in a manner such as the one shown at the bottom of FIG. 3. In the bottom, the first tuple from the left, <Symbol 0,60>, and the second tuple from the left, <Symbol 1,−50>, are still allocated six bits for storage of their probabilities. However, the probability associated with the second tuple is now expressed as a differential (Δ LDR=−50) from first tuple, rather than as its actual value (10). The probability associated with the third tuple from the left may be similarly expressed as a differential (Δ LDR=−7), except that five bits are allocated to the storage of the probability, rather than six. Only four bits are allocated to the storage of the differential probability associated with the far-right tuple, <Symbol 2,−25>. Accordingly, the probability associated with the far right tuple is first determined as a differential (the difference between 3 and −25 is −28) and then truncated to a highest value expressible with its allocated bits (Δ LDR=−15). The signs of the differences may be discarded as it may be assumed that each sign is negative.

Additionally or alternatively, it might be the case that a number of tuples may have identical or substantially similar probabilities. In various cases this may be due at least in part on bit allocation and truncation described above. In any case, in various embodiments, rather than storing a separate probability (either actual or differentials between) for each tuple, a single instance of a probability may be associated with multiple tuples, particularly towards an end of a sorted set of tuples having the lowest probabilities. When combined with the techniques described above, this may conserve even more computing resources.

For example, assume the following LDRs (or absolute values of differences between LDRs) associated with m=13 tuples: {99, 70, 55, 48, 45, 40, 40, 40, 39, 39, 39, 39, 38}. In various embodiments, memory locations may be shared by multiple tuples. In this example, a single memory location may be used to store a single probability (e.g., 39), and the last eight tuples may refer to this same memory location (e.g., using pointers) as their respective probabilities. In this example, the last eight LDRs are relatively close to each other in value, but that is not meant to be limiting. A single memory location may be used to store an LDR for multiple tuples even where the probabilities are dissimilar, particularly when the tuples sharing the memory location are those with the lowest probabilities in a set.

Figure 4:
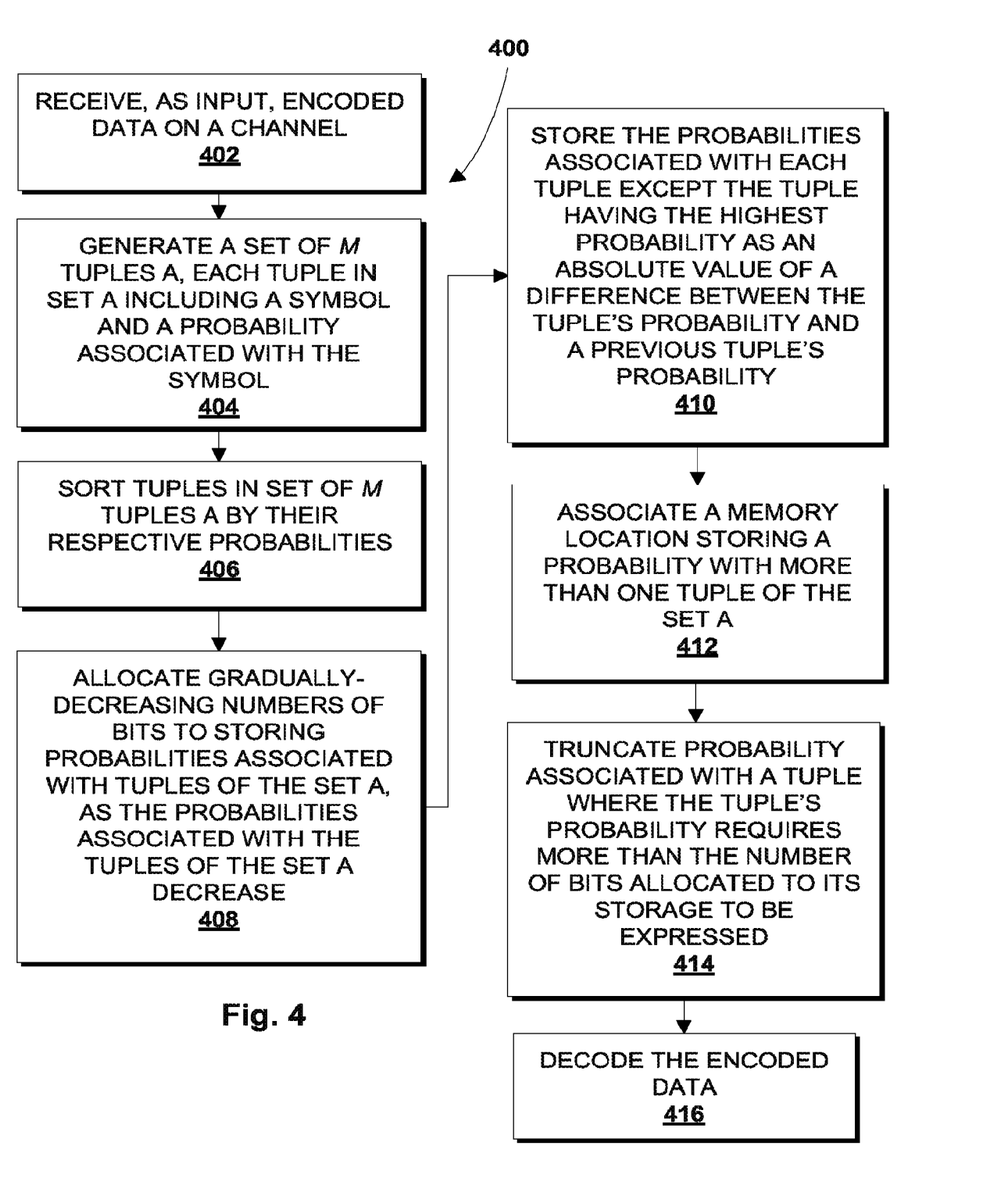
FIG. 4 schematically depicts an example method, in accordance with various embodiments.

FIG. 4 depicts an example method 400 that may be implemented, e.g., by an iterative decoder such as iterative decoder 12 of FIG. 1, to decode encoded data on a channel, in accordance with various embodiments. At block 402, the iterative decoder may receive, as input, encoded data on a channel. For example, and as discussed above, the iterative decoder may receive encoded data from non-volatile memory or from a wired or wireless communications channel. At block 404, a set A of m tuples may be generated, e.g., by iterative decoder 12, wherein each tuple includes a symbol and a probability (e.g., an LDR) that the symbol is correct.

At block 406, the set A of m tuples may be sorted, e.g., by iterative decoder 12, by their respective probabilities. For example, the set A may be sorted so that a tuple having the highest probability is at position 0 (e.g., far left in FIG. 3) or at position m−1 (e.g., far right in FIG. 3).

At block 408, gradually-decreasing numbers of bits may be allocated, e.g., by iterative decoder 12, to storage of probabilities associated with tuples of the set A, as the probabilities associated with the tuples of the set A decrease. In various embodiments, at block 410, the probabilities associated with each tuple (except, in some cases, the tuple with the highest associated probability) may be stored, e.g., by iterative decoder 12, as an absolute value of a difference between a probability associated with the tuple and an immediately previous tuple's probability.

At block 412, in various embodiments, a memory location storing a probability may be associated, e.g., by iterative decoder 12, with more than one tuple of set A. For example, the memory location storing the probability may be associated with two or more tuples of the set A having equal or approximately equal associated probabilities.

At block 414, a probability associated with a tuple may be truncated, e.g., by iterative decoder 12, where the probability associated with the tuple requires more than the number of bits allocated to its storage to be expressed. For example, in FIG. 3, the last tuple, <Symbol 2,−28> was expressed as <Symbol 2,−15> because 15 is the maximum number expressible with the four bits allocated to storage of the tuple's probability. At block 416, the encoded data may be decoded using the m tuples and their associated probabilities, which may be stored as differences, truncated and/or expressed in fewer bits, as described above.

Figure 5:
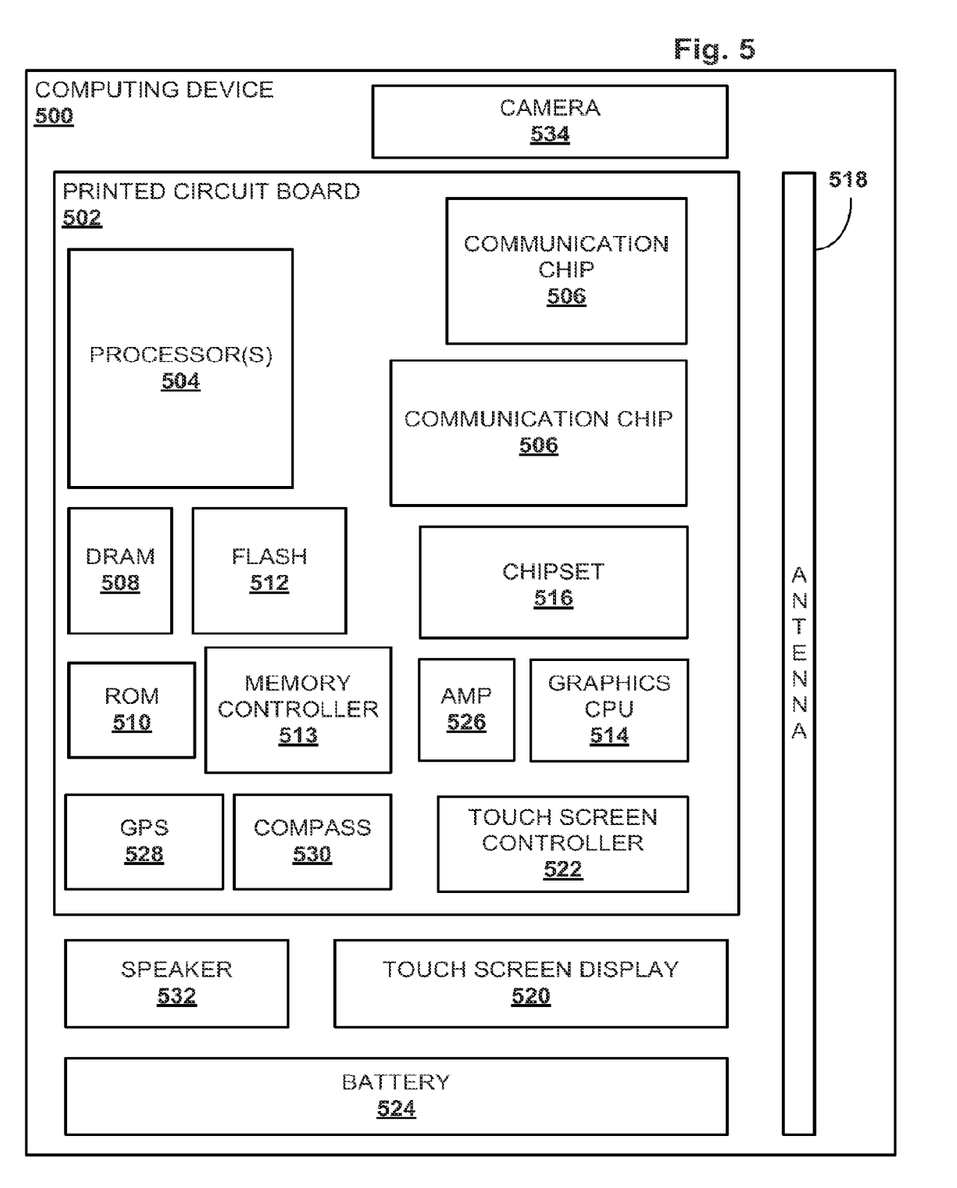
FIG. 5 schematically depicts an example system, in accordance with various embodiments.

FIG. 5 illustrates a computing device 500 in accordance with various embodiments.

The computing device 500 houses a printed circuit board ("PCB") 502. The PCB 502 may include a number of components, including but not limited to a processor 504 and at least one communication chip 506. The processor 504 may be physically and electrically coupled to the PCB 502. In various embodiments, the at least one communication chip 506 may also be physically and electrically coupled to the PCB 502. In further implementations, the communication chip 506 may be part of the processor 504. In various embodiments, the processor 504 may be integrated on the same die with other components to form a System on Chip ("SoC").

Depending on its applications, computing device 500 may include other components that may or may not be physically and electrically coupled to the PCB 502. These other components include, but are not limited to, volatile memory (e.g., DRAM 508), non-volatile memory (e.g., ROM 510), flash memory 512, a memory controller 513, a graphics processor 514, a digital signal processor (not shown), a crypto processor (not shown), a chipset 516, an antenna 518, a display (not shown), a touch screen display 520, a touch screen controller 522, a battery 524, an audio codec (not shown), a video codec (not shown), a power amplifier 526, a global positioning system ("GPS") device 528, a compass 530, an accelerometer (not shown), a gyroscope (not shown), a speaker 532, a camera 534, and a mass storage device (such as hard disk drive, compact disk ("CD"), digital versatile disk ("DVD"))(not shown), and so forth.

The communication chip 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, Long Term evolution ("LTE"), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 may include an integrated circuit die packaged within the processor 504. In various embodiments, the integrated circuit die of the processor 504 may include one or more devices, such as transistors or metal interconnects, that are formed to facilitate iterative decoding of codewords using one or more techniques described herein. The term "processor" may refer to any device or portion of a device that processes electronic data from registers and/or memory to transform that electronic data into other electronic data that may be stored in registers and/or memory.

The communication chip 506 may also include an integrated circuit die packaged within the communication chip 506. In various embodiments, the integrated circuit die of the communication chip 506 may include one or more devices, such as transistors or metal interconnects, that are formed to facilitate iterative decoding of codewords.

In various implementations, the computing device 500 may be a laptop, a netbook, a notebook, an ultrabook, a smart phone, a tablet, a personal digital assistant ("PDA"), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The following paragraphs describe various embodiments. In various embodiments, a plurality of bits of encoded data of a channel may be received, e.g., by an iterative decoder. In various embodiments, a set of m tuples A, each tuple in set A including a symbol comprising a group of bits of the encoded data and a probability associated with the symbol, may be generated, e.g., by an iterative decoder. In various embodiments, the encoded data may be decoded, e.g., by an iterative decoder, using the set of m tuples. This may include allocating fewer bits to storage of a probability associated with a first tuple of the set A than are allocated for storage of a probability associated with a second tuple of the set A.

In various embodiments, the m tuples of set A may be sorted, e.g., by an iterative decoder, by their respective probabilities. In various embodiments, for each tuple $A_x$ of the m tuples, wherein $A_0$ is a tuple having a probability greater than or equal to probabilities of all other tuples of set A, and wherein x is an integer and $1 \leq x \leq m-1$, an iterative deoder may store the probability of $A_x$ as a difference between the probability of $A_x$ and a probability of $A_{x-1}$. In various embodiments, storing the probability of $A_x$ as a difference between the probability of $A_x$ and a probability of $A_{x-1}$ may include storing an absolute value of the difference between the probability of $A_x$ and the probability of $A_{x-1}$. In various embodiments, the probability associated with the first tuple may be less than the probability associated with the second tuple.

In various embodiments, the probability associated with the first tuple may be truncated, e.g., by an iterative decoder, where the probability associated with the first tuple requires more than a predetermined number of bits to be expressed. In various embodiments, a memory location storing a probability may be associated, e.g., by an iterative decoder, with more than one tuple of the set A. In various embodiments, a single bit may be allocated, e.g., by an iterative decoder, for storage of a probability associated with at least one tuple of the set A. In various embodiments, six bits may be allocated, e.g., by an iterative decoder, for storage of a probability associated with another tuple of the set A having a probability that is greater than the probability associated with the at least one tuple of the set A to which the single bit was allocated for storage.

In various embodiments, gradually-decreasing numbers of bits may be allocated, e.g., by an iterative decoder, to storage of probabilities associated with tuples of the set A, as the probabilities associated with tuples of the set A decrease. In various embodiments, the iterative decoder may be an LDPC decoder.

Computer-readable media (including non-transitory computer-readable media), methods, systems and devices for performing the above-described techniques are illustrative examples of embodiments disclosed herein.

Although certain embodiments have been illustrated and described herein for purposes of description, a wide variety of alternate and/or equivalent embodiments or implementations calculated to achieve the same purposes may be substituted for the embodiments shown and described. This application is intended to cover any adaptations or variations of the embodiments discussed herein. Therefore, it is manifestly intended that embodiments described herein be limited only by the claims and the equivalents thereof.

What is claimed is:

1. A system, comprising:
   a channel; and
   an iterative decoder to decode encoded data on the channel, the iterative decoder configured to:
      generate a set of m tuples A, each tuple in set A including a symbol comprising a group of bits of the encoded data and a probability associated with the symbol; and
      decode the encoded data using the set of m tuples, including allocating fewer bits to storage of a probability associated with a first tuple of the set A than are allocated for storage of a probability associated with a second tuple of the set A.

2. The system of claim 1, wherein the m tuples of set A are sorted by their respective probabilities.

3. The system of claim 2, wherein the iterative decoder is further configured to, for each tuple $A_x$ of the m tuples, wherein $A_0$ is a tuple having a probability greater than or equal to probabilities of all other tuples of set A, and wherein x is an integer and $1 \leq x \leq m-1$, store in memory of the system, the probability of $A_x$ as a difference between the probability of $A_x$ and a probability of $A_{x-1}$.

4. The system of claim 3, wherein the iterative decoder is further configured to store an absolute value of the difference between the probability of $A_x$ and a probability of $A_{x-1}$.

5. The system of claim 1, wherein the probability associated with the first tuple is less than the probability associated with the second tuple.

6. The system of claim 5, wherein the iterative decoder is further configured to truncate the probability associated with the first tuple where the probability associated with the first tuple requires more than a predetermined number of bits to be expressed.

7. The system of claim 1, wherein the iterative decoder is further configured to associate a memory location storing a probability with more than one tuple of the set A.

8. The system of claim 1, wherein the iterative decoder is further configured to allocate a single bit for storage of a probability associated with at least one tuple of the set A.

9. The system of claim 8, wherein the iterative decoder is further configured to allocate six bits for storage of a probability associated with another tuple of the set A having a probability that is greater than the probability associated with the at least one tuple of the set A to which the single bit was allocated for storage.

10. The system of claim 1, wherein the iterative decoder is further configured to allocate gradually-decreasing numbers of bits to storage of probabilities associated with tuples of the set A, as the probabilities associated with tuples of the set A decrease.

11. A computer-implemented method of decoding encoded data on a channel, comprising:
- receiving, by an iterative decoder, a plurality of bits of the encoded data;
- generating, by the iterative decoder, a set of m tuples A, each tuple in set A including a symbol comprising a group of bits of the encoded data and a probability associated with the symbol; and
- decoding, by the iterative decoder, the encoded data using the set of m tuples, including allocating fewer bits to storage of a probability associated with a first tuple of the set A than are allocated for storage of a probability associated with a second tuple of the set A.

12. The computer-implemented method of claim 11, wherein the m tuples of set A are sorted by their respective probabilities.

13. The computer-implemented method of claim 11, wherein the probability associated with the first tuple is less than the probability associated with the second tuple.

14. The computer-implemented method of claim 11, further comprising associating, by the iterative decoder, a memory location storing a probability with more than one tuple of the set A.

15. The computer-implemented method of claim 11, further comprising allocating, by the iterative decoder, a single bit for storage of a probability associated with at least one tuple of the set A.

16. The computer-implemented method of claim 11, further comprising allocating, by the iterative decoder, gradually-decreasing numbers of bits to storage of probabilities associated with tuples of the set A, as the probabilities associated with tuples of the set A decrease.

17. One or more non-transitory computer-readable media comprising instructions to cause an iterative decoder, upon execution of the instructions by one or more processors coupled with the iterative decoder, to:
- receive a plurality of bits of encoded data on a channel;
- generate a set of m tuples A, each tuple in set A including a symbol comprising a group of bits of the encoded data and a probability associated with the symbol; and
- decode the encoded data using the set of m tuples, including allocating fewer bits to storage of a probability associated with a first tuple of the set A than are allocated for storage of a probability associated with a second tuple of the set A.

18. The one or more non-transitory computer-readable media of claim 17, wherein the m tuples of set A are sorted by their respective probabilities.

19. The one or more non-transitory computer-readable media of claim 17, wherein the probability associated with the first tuple is less than the probability associated with the second tuple.

20. The one or more non-transitory computer-readable media of claim 17, wherein the instructions are further to associate a memory location storing a probability with more than one tuple of the set A.

21. The one or more non-transitory computer-readable media of claim 17, wherein the instructions are further to allocate a single bit for storage of a probability associated with at least one tuple of the set A.

22. The one or more non-transitory computer-readable media of claim 17, wherein the instructions are further to allocate gradually-decreasing numbers of bits to storage of probabilities associated with tuples of the set A, as the probabilities associated with tuples of the set A decrease.

* * * * *